FREQUENCY MODULATED OSCILLATOR CIRCUITS

Filed Dec. 12, 1957 2 Sheets-Sheet 1

Inventor
Ivor Albert Ravenscroft
By
Stevens, Davis, Miller & Mosher
Attorneys

March 7, 1961 I. A. RAVENSCROFT 2,974,294

FREQUENCY MODULATED OSCILLATOR CIRCUITS

Filed Dec. 12, 1957 2 Sheets-Sheet 2

Inventor
Ivor Albert Ravenscroft
By Stevens, Davis, Miller & Mosher
Attorneys

United States Patent Office 2,974,294

Patented Mar. 7, 1961

2,974,294

FREQUENCY MODULATED OSCILLATOR CIRCUITS

Ivor Albert Ravenscroft, Caerleon, near Newport, England, assignor to National Research Development Corporation, London, England, a corporation of England Filed Dec. 12, 1957, Ser. No. 702,304

Claims priority, application Great Britain Dec. 13, 1956

3 Claims. (Cl. 332—16)

The present invention relates to frequency modulated oscillator circuits employing grid modulation and has for an object to provide an improved frequency modulated oscillator circuit in which the non-linear distortion is of a very low order, and which is suitable for use over a broad band of modulation frequencies.

According to the invention a frequency modulated oscillator circuit is provided with negative feedback means in the stage or stages controlling the frequency of oscillation for maintaining substantially linear the relation between the frequency of the oscillator and the input voltage to the stage or each stage.

The invention finds special application to the frequency modulated circuits disclosed in British patent specification 731,592 and according to a further feature of the invention a frequency-modulated valve oscillator circuit includes means for balancing out unwanted modulation frequency components.

In such frequency-modulated valve oscillators the amount of distortion is chiefly determined by:

(*a*) The shape of the mutual conductance-grid voltage characteristics of the valve or valves controlling the frequency of the oscillator and, (*b*) Development of distorted modulation signals in the oscillator circuit which cause modulation distortion.

In the case of most frequency-modulated oscillators the frequency is not an absolutely linear function of mutual conductance so that some compensation of the frequency/mutual conductance characteristic is desirable. Even in the case of an oscillator whose frequency is a linear function of mutual conductance, if the circuit is of the type using a plurality of earthed grid valves in cascade, for obtaining optimum results it is necessary that each earthed grid valve should operate over the most linear portion of its mutual conductance-grid voltage characteristic, and since at the lower values of mutual conductance the said characteristic is not linear it is necessary to operate the valve at a mutual conductance which in many cases is higher than desirable.

It has been found that by applying negative feedback over a stage including an earthed grid valve, the transconductance-input voltage characteristic of the stage can be made to differ from the mutual conductance-grid voltage characteristic of the valve. In particular, it can be made more linear than the mutual conductance-grid voltage characteristic of the valve. By transconductance of the stage is meant the first derivative of the output current of the stage with respect to the input voltage thereof. The transconductance measured directly between the control grid and anode of a valve alone is commonly called the mutual conductance. The linear relationship can be maintained down to low values of transconductance even though for equivalent values of mutual conductance of the valve the relationship between mutual conductance and grid voltage is non-linear.

The negative feedback referred to may conveniently be applied in one of two ways, viz:

(1) by feeding voltage back from the anode circuit to the grid of the valve, and, (2) by employing cathode feedback.

The invention will now be described with reference to the accompanying drawings, in which.

Figure 1:
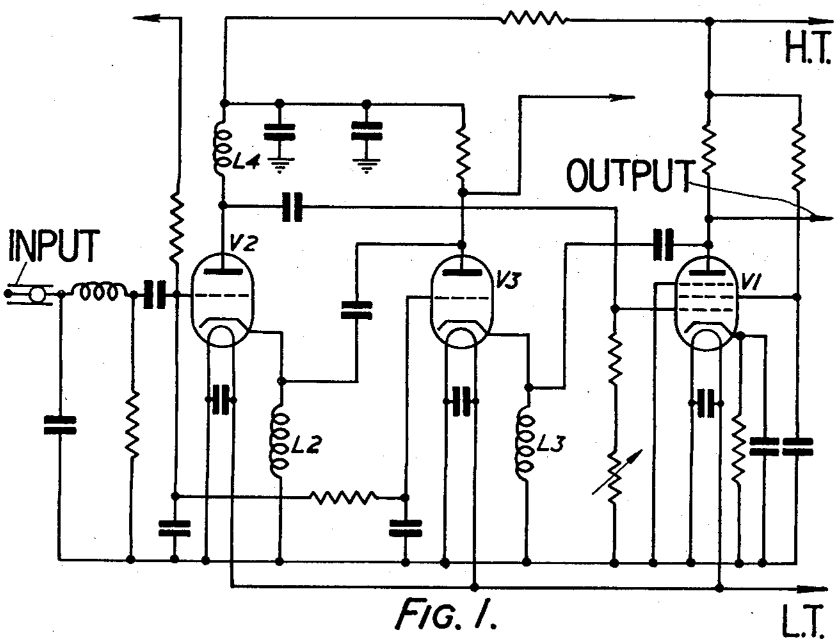
Figure 1 is a circuit diagram of a typical frequency modulated oscillator.

Referring firstly to Figure 1 of the drawings, it will be observed that in order to provide a direct current circuit for the earthed grid valves V2 and V3, chokes L2, L3 and L4 are provided respectively in the cathode circuits of V2 and V3 and in the anode circuit of V2. The inductance values of the chokes L2, L3 and L4 must be such that a high impedance is offered to the carrier frequency and a low impedance to modulation frequencies and the choice of inductance value is generally governed by the shunt capacity across the circuit and the parallel resonance of the combination is adjusted so as to lie immediately below the frequency band required. Such a condition gives the lowest permissible value of inductance and in a practical case of an oscillator operating around 35 mc./s., the inductance of L2 and L3 is made approximately 8$\mu$h. giving a reactance of 120 ohms at a modulation frequency of 2.5 mc./s. If the value of mutual conductance required by the oscillator is 4.5 ma. per volt, the magnitude of the modulation signals developed across each choke is about −6 db relative to the applied modulating voltage and part of this signal consists of distorted components because the valve is operating over the non-linear portion of its anode current-grid voltage characteristic.

If such a circuit is required for broad band modulation giving low levels of distortion it is necessary to remove to a large extent the modulation components developed across the cathode chokes and according to one feature of the invention this is effected by making the trans-conductance of the stages including valves V2 and V3 substantially equal. Thus the choke L2 is the combined load—at modulation frequencies—of the V3 anode and the V2 cathode and when the valves V2 and V3 are adjusted to have equal mutual conductance the signals through L2 cancel out. The preferred method of equalising the transconductance of the stages including valves V2 and V3 is by providing a direct current differential bias adjustment in the grid circuit of each valve. In a similar manner cancellation can be effected in the cathode circuit of valve V3 by providing a further triode similar to V3 and having its anode connected across the choke L3, the said further triode having its grid connected directly to a second adjustable bias supply and having an alternating current connection to the oscillator valve grids. In this manner by suitable adjustment of the grid bias of the further triode the transconductance of the stage can be made substantially equal to that of valve stage V3 so that modulation signals across the choke L3 cancel out.

Figure 2:
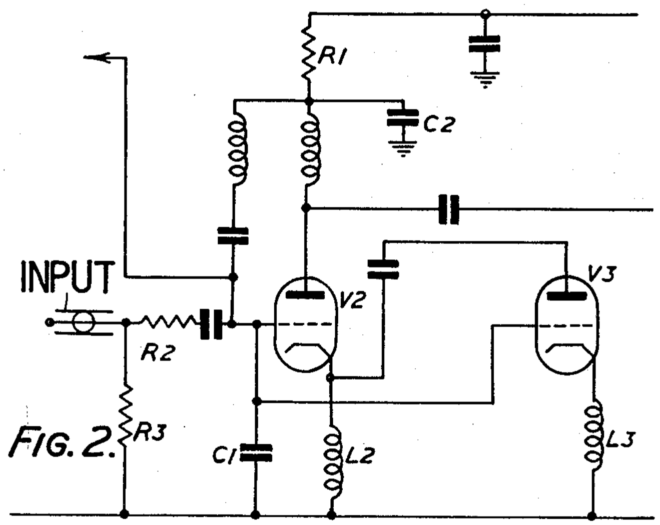
Figure 2 is a circuit diagram of one stage of a frequency modulated oscillator according to the invention and provided with voltage feedback.

In order to improve the transconductance-input voltage characteristic of the earthed grid stages another feature of the invention provides for applying negative feedback over each valve and as hereinbefore stated the negative feedback can be applied by feeding voltage back from the anode circuit to the grid of the valve or by employing cathode feedback. Figure 2 of the drawings shows the circuit of one stage of the oscillator of Figure 1 modified to provide voltage feedback over the valve V2 by extracting a small portion of the signal voltage in the anode circuit of the valve and applying it back to the grid circuit. As will be seen from Figure 2, the feedback is applied to the grid circuit by connecting the feedback resistor R1 through a low-pass filter network to the grid circuit. The shunt capacities C1 and C2 of the filter function as de-coupling reactances at the oscillator frequency in the grid and anode circuits respectively, and terminations are made in the feedback resistor R1 and in the matching and padding networks R2 and R3. Feedback is thus effective over the low-pass frequency range of the filter, which is designed to accommodate the predominant harmonics generated by the valve and the amount of feedback is controlled by the characteristic resistance of the filter. In the circuit shown in Figure 2, the feedback taken from the anode of valve V2 is also applied to the grid of valve V3.

In the case of cathode feedback, one known method of applying feedback over a valve is to insert an unbypassed resistor in the cathode circuit of the valve but in the oscillator circuit under consideration, this would have little or no effect upon the trans-conductance-input voltage characteristic of the stage since any cathode voltage that would be developed is cancelled due to the equality of the mutual conductances of the earthed grid valves as previously described. In the case where the ultimate requirement in a frequency modulated oscillator is limited to extreme linearity of the frequency/voltage characteristic at low modulation frequencies, then the aforementioned cancellation circuits may not be necessary and a cathode resistor may be employed for giving negative feedback and thus improving the linearity of the transconductance input voltage characteristic.

Figure 3:
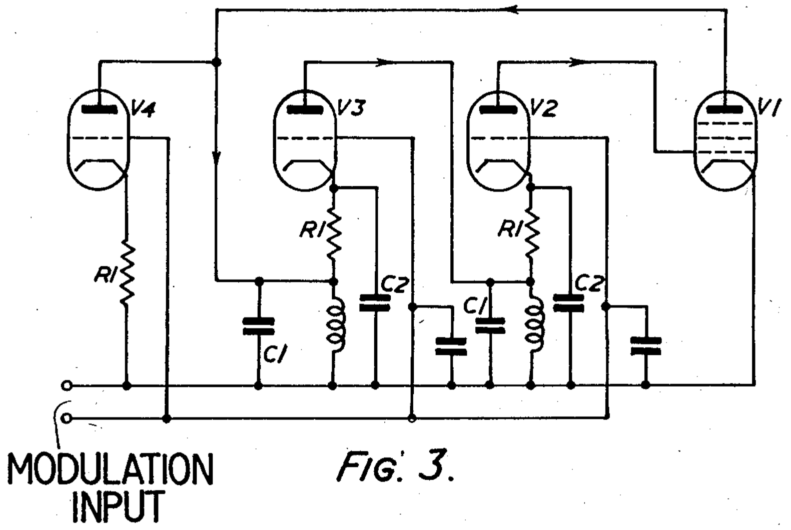
Figure 3 is a circuit diagram of a frequency modulated oscillator according to the invention provided with a cathode feedback.

However, when both linearity and broad modulation band width are required, a circuit such as that shown in Figure 3 is provided. It will be observed that the R.F. coupling between the valves is not fed directly to the cathodes of the earthed grid triodes V2, V3 but is connected to the end of the cathode resistor R1 distant from the connection thereof to the cathode. In this manner modulation frequencies are developed across each cathode resistor R1 to give the required effect of negative feedback and at the same time the signals are cancelled out across the inductance connection in each of the cathode circuits. It should be noted in the circuit diagram of Figure 3, that the capacities C1 and C2 may represent the stray capacities only of the circuits.

The value of the cathode resistor required to improve the linearity of the circuit depends upon the valve used, but a typical value may be 15 ohms. Its effect upon the linearity of the frequency/mutual conductance characteristic as distinct from the frequency-voltage characteristic is small and is such as to assist the effect of the negative feedback by introducing a nonlinear coefficient that tends to cancel that already existing in the overall frequency-voltage characteristic.

Figure 4:
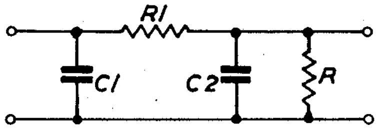
Figure 4 is an equivalent circuit of an intervalve stage of the circuit of Figure 3.

The equivalent circuit of an inter-valve stage preceding one of the earthed grid valves is shown in Figure 4 where it will be seen that the total capacities across the circuit are divided by the feedback resistor R1 and consists of the anode capacity of the previous valve and the stray capacities associated therewith (C1) and the cathode capacity and its associated stray capacities (C2). The inclusion of the feedback resistor R1 modifies the formula giving the frequency of oscillation in terms of the mutual conductance ($g_m$) of the valve to the following approximate form $$g_m=(C_1+C_2)W+C_1C_2R_1W^2$$

From this it will be seen that the magnitude of the non-linear coefficient depends, all other factors remaining similar, upon the value of the feedback resistor R1 and as the latter approaches zero, the formula approaches the linear condition.

If the gm./voltage characteristic of the valve over the limited portion thereof occupied by the signal is represented by the equation $$g_m=a.v_1+b.v_1^2$$

then for low levels of distortion the second order coefficient is cancelled out when the following condition is met $$C_1C_2R_1=\frac{b(C_1+C_2)^2}{a^2}$$

In practice the value of R1 is very much smaller than that required to produce such cancellation, but at least, its effect upon the linearity of the circuits reinforces that due to the negative feedback and no adverse effects are noticed. The result is that a smaller value of R1 is required to linearise the characteristic of the frequency modulated oscillator than would be needed to linearise the transconductance characteristic of the stage.

Cathode feedback is preferred to voltage feedback, since it is less dependent upon the modulation frequency. It relies for its action upon a small resistance inserted in the cathode circuit, whereas the voltage feedback depends in magnitude and in phase upon a low-pass filter or other appropriate network involving reactances. Furthermore the cathode feedback has the advantage that it has little effect upon the input impedance at the modulation input terminals of the oscillator circuit so that padding net-works involving loss of gain are not required.

The improved frequency modulated oscillators according to the invention are specially suitable for use in multi-channel telephone systems in which non-linearity leads to inter-channel cross-talk and thus sets a limit to the number of channels that can usefully be employed. In one application of the invention to multi-channel micro-wave links it was found possible to provide at least 600 channels without serious cross-talk between channels.

I claim:

1. A frequency modulated valve oscillator circuit comprising a plurality of valve stages at least two of which valve stages control the frequency of the oscillator, each of said frequency controlling valve stages including a cathode-driven valve, means for earthing the grid of said valve at carrier frequency, and a feedback resistor in the cathode circuit of the said valve for effecting negative feedback over the valve; and means for equalizing the transconductances of the said two valve stages, thereby to balance out the modulation frequency components.

2. A frequency modulated oscillator according to claim 1, wherein the anode circuit of an additional valve of similar type to the said earthed-grid valves is connected across the D.C. return path in the cathode circuit of one of the earthed-grid valves, but does not form part of the carrier feedback loop, and has its grid connected, at modulation frequencies, to the grids of the modulated valves, the transconductances of the additional valve being made equal to that of the earthed-grid valve.

3. A frequency modulated oscillator according to claim 1, wherein the transconductances of the stages are equalized by means of direct current differential bias adjustment in the grid circuit of each valve.

References Cited in the file of this patent

UNITED STATES PATENTS

| | | |
|---|---|---|
| 2,218,526 | DeLange | Oct. 22, 1940 |
| 2,753,525 | Dodington | July 3, 1956 |
| 2,761,973 | Hodson | Sept. 4, 1956 |
| 2,817,017 | Hall | Dec. 17, 1957 |